(12) United States Patent
Yan et al.

(10) Patent No.: US 11,870,341 B2
(45) Date of Patent: Jan. 9, 2024

(54) ISOLATED POWER CONVERTER PACKAGE WITH MOLDED TRANSFORMER

(71) Applicant: Texas Instruments Incorporated, Dallas, TX (US)

(72) Inventors: Yi Yan, San Jose, CA (US); Vivek Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 139 days.

(21) Appl. No.: 17/677,072

(22) Filed: Feb. 22, 2022

(65) Prior Publication Data

US 2023/0268826 A1   Aug. 24, 2023

(51) Int. Cl.
| H02M 3/00 | (2006.01) |
| H02M 3/335 | (2006.01) |
| H01F 41/02 | (2006.01) |
| H01F 27/30 | (2006.01) |
| H05K 7/20 | (2006.01) |

(52) U.S. Cl.
CPC ............ *H02M 3/003* (2021.05); *H01F 27/30* (2013.01); *H01F 41/0246* (2013.01); *H02M 3/33523* (2013.01); *H05K 7/2089* (2013.01)

(58) Field of Classification Search
CPC ..... G06F 1/263; H02M 1/10; H02M 3/33561; H02M 7/003; H02M 3/088; H02M 3/1584; H02M 1/084; H02M 3/003; H02M 3/33523; H01L 25/112; H01L 25/115; H01L 23/34; H01L 23/528; H01L 27/088; H01L 29/088; H01L 29/2003; H01L 23/49503; H01L 23/49562; H01L 23/49575; H01L 23/62; H01L 23/072; H01L 23/0248; H01L 29/1033; H01L 29/402; H01L 29/41758; H01R 13/6675; H01R 29/00; H01R 31/065; G09G 3/20; H02K 11/046; H01F 2027/406; H01F 27/30; H01F 41/0246; H05K 7/20927; H05K 2201/10166; H05K 2201/10507; H05K 7/2089
See application file for complete search history.

(56) References Cited

U.S. PATENT DOCUMENTS

| 6,646,531 B2 | 11/2003 | Kim | |
| 7,994,887 B2 * | 8/2011 | Yang | ...................... H01F 27/08 336/84 R |
| 2013/0181332 A1 * | 7/2013 | Kelkar | ................ H01L 23/3107 257/E23.051 |
| 2021/0375525 A1 * | 12/2021 | Kao | ........................ H01L 28/10 |

* cited by examiner

*Primary Examiner* — Jeffrey A Gblende
(74) *Attorney, Agent, or Firm* — Ronald O. Neerings; Frank D. Cimino (57) ABSTRACT

An isolated power converter package includes a leadframe including a first and second die pad, first and second supports connected to first leads, second leads. A first semiconductor die is on the first die pad and a second semiconductor die is on the second die pad. The molded transformer includes a top and bottom side magnetic sheet each having a magnetic mold material including magnetic particles in a second dielectric material on respective sides of a laminate substrate including a dielectric material and a first coil and a second coil that each include a coil contact. Edges of the laminate substrate are on the supports. Bond wires are between the first die bond pads and the second leads, between the second die bond pads and the second leads, between the first die bond pads and coil contacts, and between the second die bond pads and the coil contacts.

20 Claims, 9 Drawing Sheets

ISOLATED POWER CONVERTER PACKAGE WITH MOLDED TRANSFORMER

FIELD

This Disclosure relates to isolated power converter packages that include a laminate transformer for the isolation between die.

BACKGROUND

Transformers are used in a variety of applications to step-up and/or step-down voltages while providing galvanic isolation between an input and an output. In a multi-phase transformer windings associated with each phase are wrapped around separate legs of a magnetic core which each comprise coil(s).

Some isolated power converter packages, such as DC/DC converter packages, include transformers for stepping up or stepping down a received input voltage. The transformer can comprise a laminate transformer that includes a laminate substrate which comprises a dielectric material generally having at least a first and a second coil embedded therein, generally including iron as the core metal for the coils to meet the requirement of a ferromagnetic metal core. There is a top magnetic sheet and a bottom magnetic sheet, both having only magnetic material, on respective sides of the laminate substrate. The lamination of iron cores in transformers is to limit the generation of what are called eddy currents. By laminating the cores, current paths within cores are broken up to thus limit eddy currents. Some transformers may include a lamination layer but do not include a ferromagnetic metal core such as iron, and are thus referred to as being transformers having air-cores.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize a conventional planar laminate transformer (top and bottom magnetic sheets with a laminate substrate in between including a first and a second coil embedded therein) assembly integration involves 3 separate mount and cure processes, and as a result, there is a significant risk of having die attach epoxy bleed out (EBO) problems. These three processes comprise application of die attach material used for the laminate substrate mount to the leadframe as well as to mount the respective magnetic sheets on opposite sides of the laminate substrate. Each mount/cure step will generally use an epoxy die-attach material, and each mount/cure step will have a chance to have an EBO problem. EBO will contaminate the leads to cause non-stick wirebond on the lead, and can also contaminate the surface of the die pad (when present) to cause delamination of the mold compound.

Disclosed aspects include an isolated power converter package that includes a leadframe including a first die pad and a second die pad, supports for supporting a molded transformer connected to a first plurality of leads, a second plurality of leads. A first semiconductor die including first bond pads is on the first die pad and a second semiconductor die including second bond pads is on the second die pad. The molded transformer includes a top magnetic sheet and a bottom side magnetic sheet both comprising a magnetic mold material on respective sides of a laminate substrate. The magnetic mold material comprises magnetic particles and a second dielectric material. The laminate substrate includes a first coil and a second coil and a dielectric material, including coil contacts on its top surface.

Bond wires are between the first bond pads and the second plurality of leads, between the second bond pads and the second plurality of leads, between the first bond pads and the coil contacts, and between the second bond pads and others of the coil contacts. A mold compound provides encapsulation for the first semiconductor die, the second semiconductor die, and the molded transformer.

BRIEF DESCRIPTION OF THE DRAWINGS

Reference will now be made to the accompanying drawings, which are not necessarily drawn to scale, wherein:

FIGS. 4A-E depict steps and results for an example method for forming a disclosed molded transformer.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal but may adjust its current level, voltage level, and/or power level.

Disclosed aspects include an isolated power converter package comprising a molded transformer, and a leadframe that includes supports used for attaching the molded transformer thereon. The leadframe can comprise a conventional leadframe such as a small outline integrated circuit (SOIC), thin small outline package (TSOP), heatsink small outline package (HSOP) leadframe, or a conventional leadless leadframe such as quad flat no leads (QFN) leadframe, a multi-layer leadframe such as a Molded Interconnect Substrate (MIS), or a routable leadframe.

Disclosed isolated power converter packages including a molded transformer can take into account isolation spacing rules and also to ensure compatibility with conventional assembly processing to enable leveraging existing manufacturing infrastructure so that no capital investment is needed to implement disclosed isolated power converter packages. Disclosed aspects can also generally be applied to all leaded and leadless isolated power converter packages.

Figure 1:
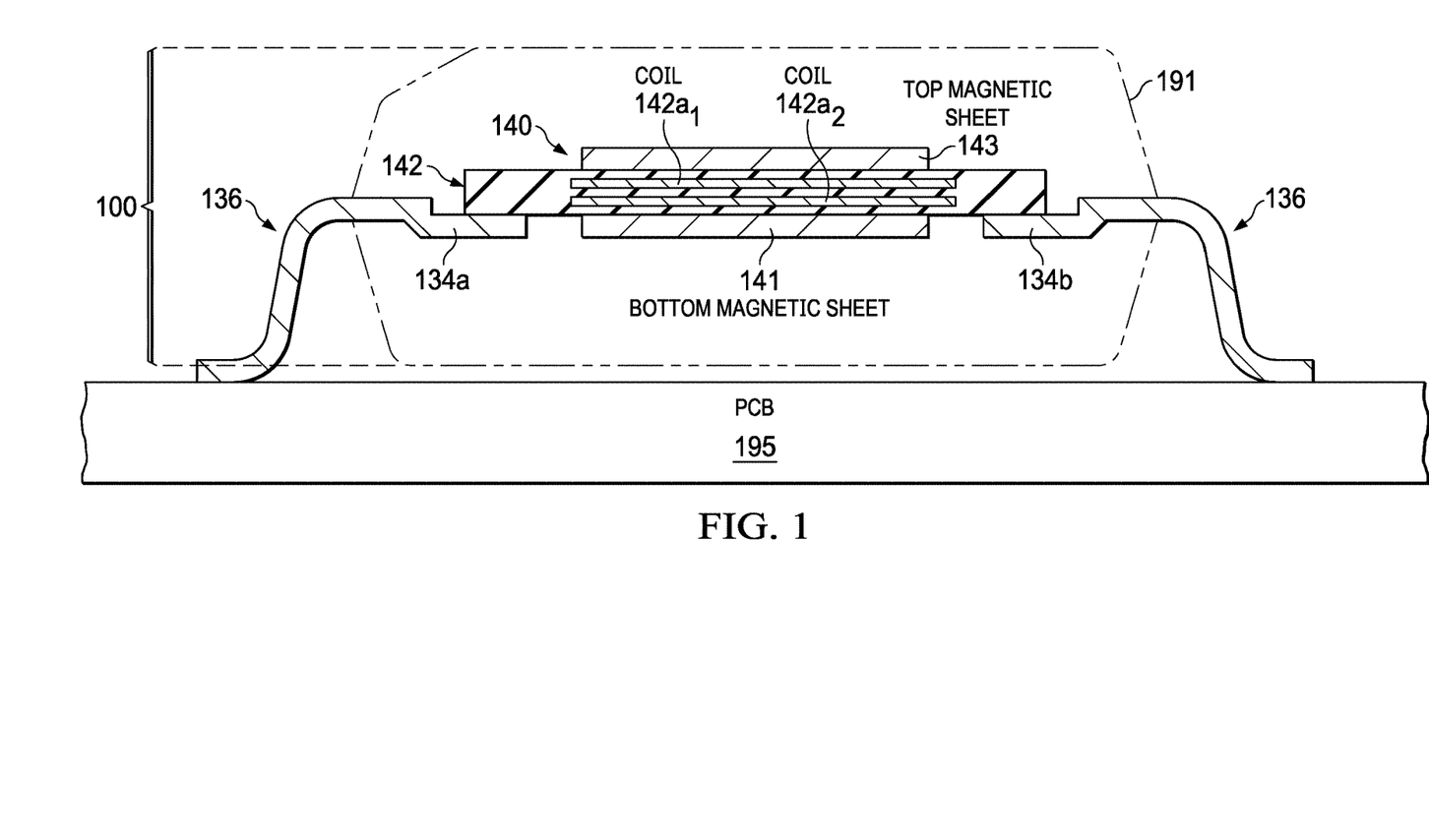
FIG. 1 is a cross-sectional view of an example isolated DC/DC converter package (ICs not shown in this cross-sectional view) including a leadframe having supports for supporting a molded transformer comprising a laminate substrate having at least a first coil and a second coil embedded therein, where the isolated DC/DC converter package is mounted onto a heatsink shown as a PCB.

FIG. 1 is a cross-sectional view of a disclosed isolated power converter package 100 including a molded transformer 140 (ICs not shown in this cross-section), and a leadframe having supports 134a, 134b for supporting the molded transformer 140, the molded transformer 140 comprising a laminate substrate 142 having a first coil 142a1 and a second coil 142a2 embedded in a dielectric material of the laminate substrate 142. The leadframe also includes leads including a first plurality of leads 136, and a second plurality of leads 138 (see leads 138 in FIG. 2), where the supports 134a, 134b are physically and thermally connected to respective sides of the first plurality of leads 136. There is a mold compound 191 for providing encapsulation for the isolated power converter package 100.

The molded transformer 140 also includes a top magnetic sheet 143 and a bottom magnetic sheet 141 both comprising a magnetic mold compound, with the laminate substrate 142 positioned between the top and bottom magnetic sheets. The isolated DC/DC converter package 100 is shown mounted onto a heatsink shown as a PCB 195 that has top side pads that are each generally connected to thermal vias (both pads and vias not shown). The laminate substrate 142 is thermally connected by the supports 134a, 134b and mounted thereon using a die attach material, that can optionally be a thermally conductive dielectric die attach material which can improve the efficiency and performance of the molded transformer 140.

As used herein the term thermally conductive adhesive or thermally conductive die attach material refers to a material having a thermal conductivity of at least 1 W/m·K. The thermally conductive material can comprise a metal particle filled epoxy material, ceramic, a composite material, solder, or sintered nanoparticles.

Figure 2:
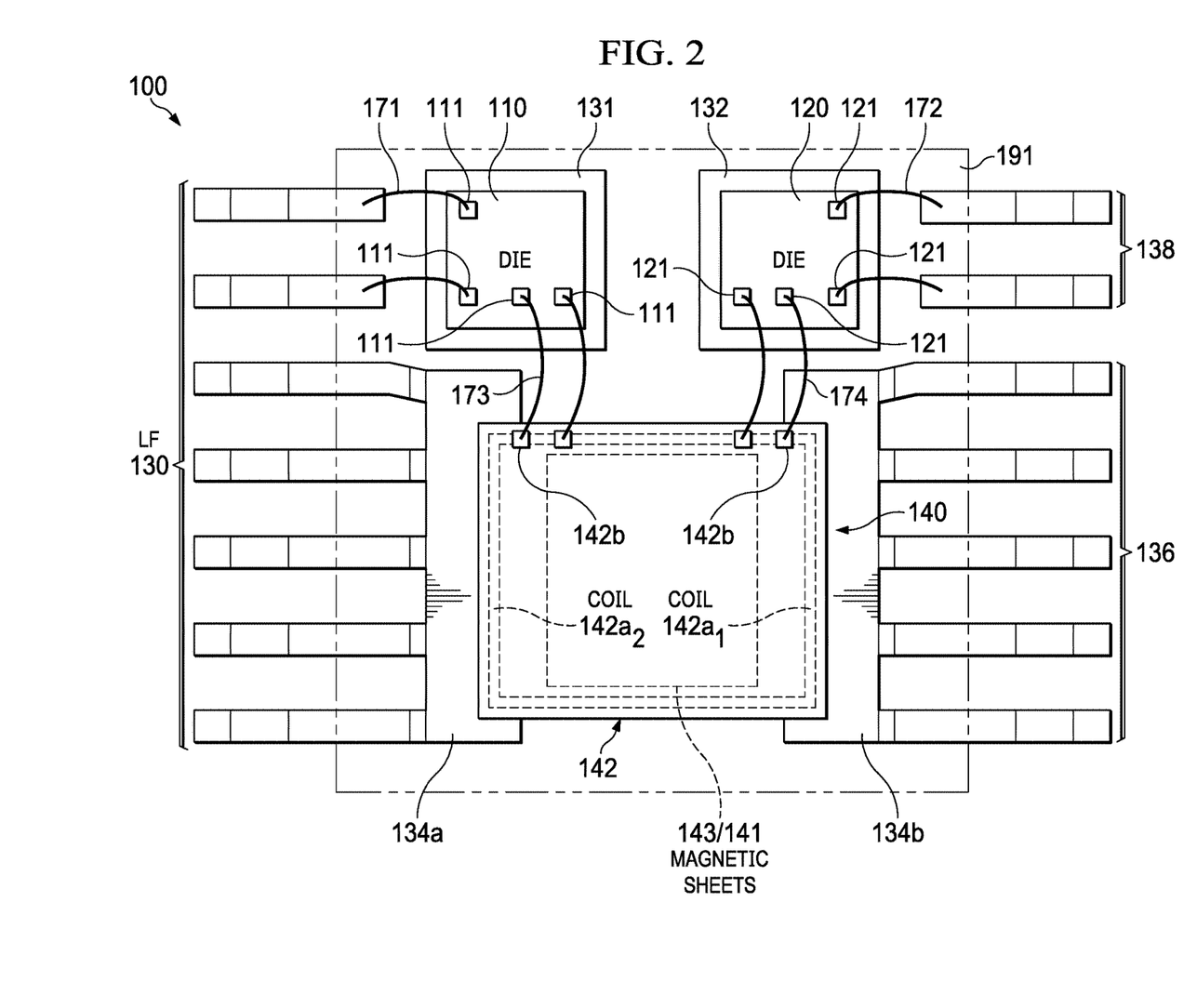
FIG. 2 is a top view looking through the mold compound of an example isolated power converter package comprising a leadframe including first and second die pads having first and second semiconductor die mounted thereon, and supports for supporting a laminate substrate. There is a molded transformer comprising a top side magnetic sheet and a bottom side magnetic sheet both comprising a magnetic mold material on respective sides of the laminate substrate.

FIG. 2 is a top view looking through the mold compound 191 of an example isolated power converter package 100 comprising a leadframe 130 including a first die pad 131 and a second die pad 132, including a first semiconductor die 110 including first bond pads 111 mounted topside up on the first die pad 131 and a second semiconductor die 120 including second bond pads 121 mounted topside up on the second die pad 132. The leadframe 130 also includes a first plurality of leads 136, and a second plurality of leads 138, and supports 134a and 134b for supporting the laminate substrate 142 of the molded transformer 140, where the supports 134a, 134b are physically connected to respective sides of the first plurality of leads 136. The molded transformer 140 may also be referred to as being a laminate transformer.

The molded transformer 140 comprises a bottom magnetic sheet 141 and a top magnetic sheet 143 both comprising a magnetic mold material positioned on respective sides of the laminate substrate 142. The laminate substrate 142 comprises at least a first coil 142a1 and a second coil 142a2 and a dielectric material that can be embedded within the dielectric material. The laminate substrate 142 includes coil contacts 142b, with generally two coil contacts per coil, positioned on its top surface. Edges of the laminate substrate 142 are attached to the supports 134a, 134b, as described above generally by a dielectric adhesive that is optionally also thermally conductive.

There are shown bond wires 171 between the first bond pads 111 and the second plurality of leads 138, bond wires 172 between the second bond pads 121 and the second plurality of leads 138, and bond wires 173 between the first bond pads 111 and the coil contacts 142b (connected to one side of each of the coils 142a1, 142a2), and bond wires 174 between the second bond pads 121 and others of the coil contacts 142b (connected to the other side of each of the coils 142a1, 142a2). The mold compound 191 provides encapsulation for the first semiconductor die 110, for the second semiconductor die 120, and for the molded transformer 140.

The respective bottom and top magnetic sheets 141 and 143 can be glued by an adhesive to the respective sides of the laminate substrate 142. A function of the bottom and top magnetic sheets 141 and 143 is to control the magnetic field around the first coil 142a1 and second coil 142a2 that are embedded within the laminate substrate 142.

The laminate substrate 142 can be mounted onto the supports 134a, 134b using an adhesive material that generally comprises a thermally conductive adhesive material which provides a 25° C. thermal conductivity of at least 1

W/m·K, such as at least 10 W/m·K. The adhesive material can comprise a metal particle filled epoxy material, a ceramic, a composite material, solder, or sintered nanoparticles.

Figure 3A:
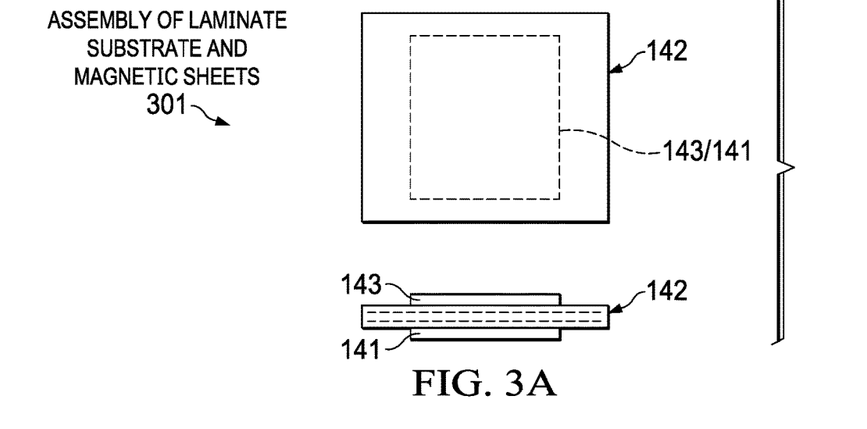
FIGS. 3A-E depict successive views of an in-process isolated power converter package corresponding to results following steps in an example method for forming a disclosed isolated power package comprising a leadframe including first and second die pads having first and second semiconductor die mounted thereon, and supports, with a molded transformer on the supports.

FIGS. 3A-E depict successive views of an in-process isolated power converter package 100 corresponding to results following steps in an example method for forming a disclosed isolated power package including a molded transformer 140. FIG. 3A shows results after step 301 which comprises providing a molded transformer 140 generally formed by the assembly of the laminate substrate and the magnetic sheets.

Figure 3B:
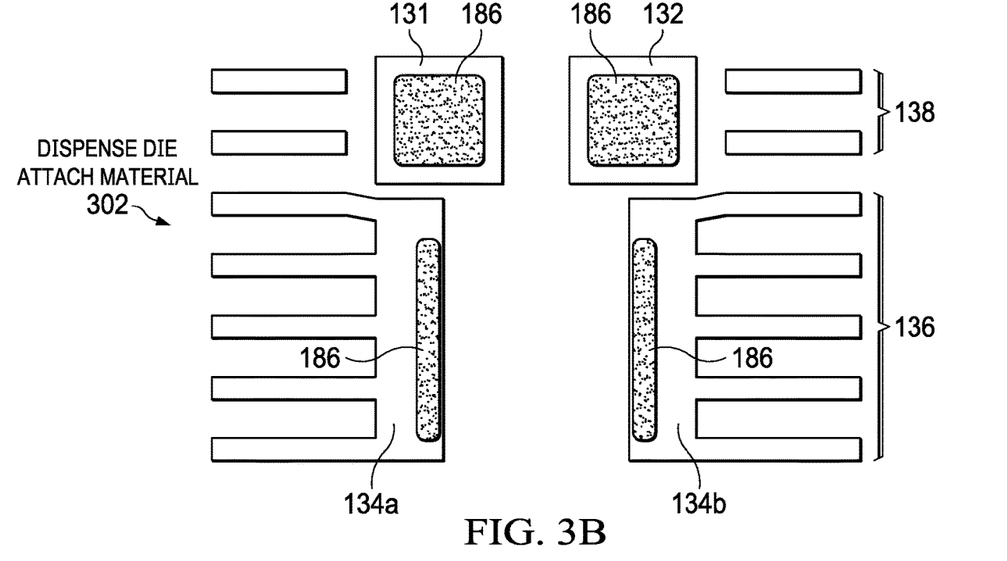

FIG. 3B shows results after step 302 comprising dispensing a die attach adhesive material 186 that is generally thermally conductive onto the first and second die pads 131, 132, and onto the supports 134a, 134b. The leadframe can be seen to also include a first plurality of leads 136 noted above to be connected to the supports 134a, 134b, and a second plurality of leads 138.

Figure 3C:
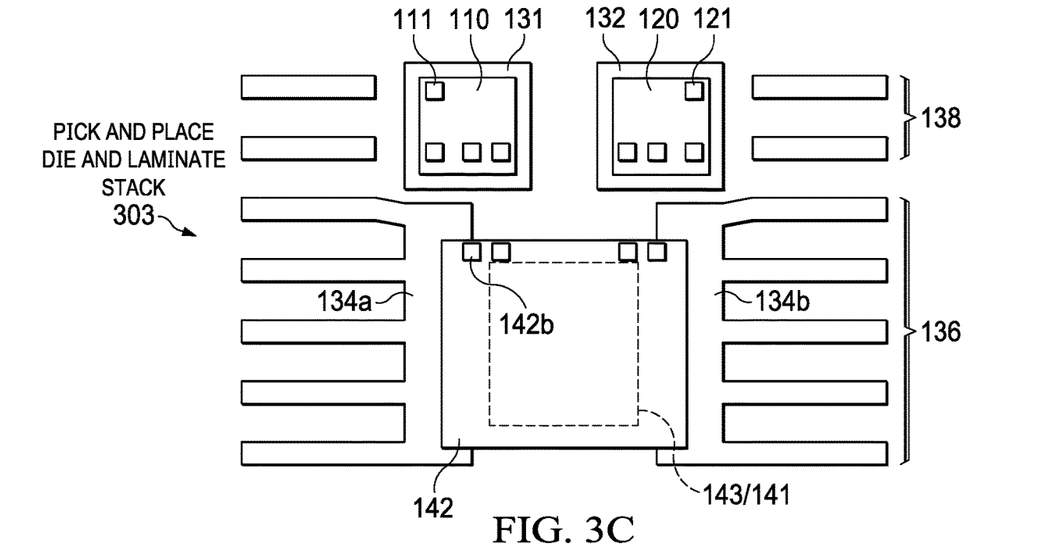
Figure 3D:
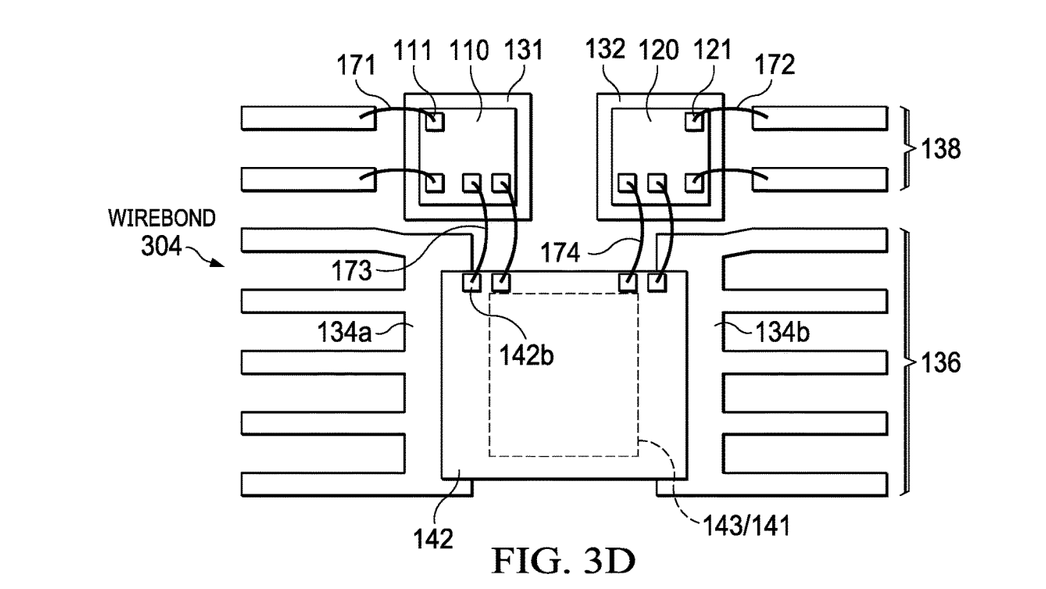
Figure 3E:
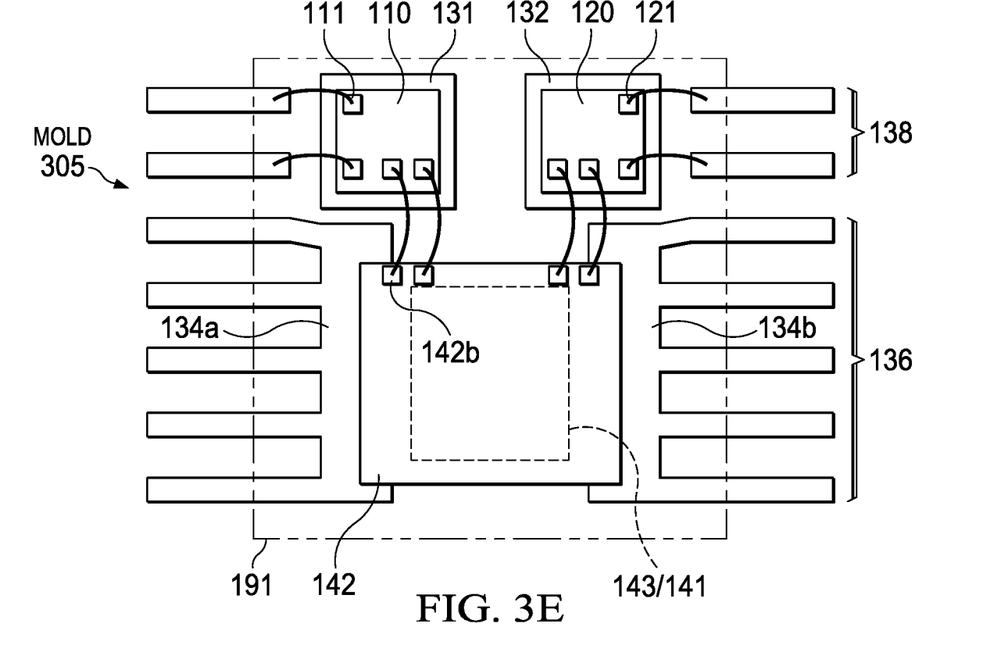

FIG. 3C shows results after step 303 comprising a pick and place of the first semiconductor die 110 on the first die pad 131, the second semiconductor die 120 on the second die pad 132, and the laminate substrate 142 of the molded transformer 140 on the supports 134a, 134b. The x-dimension of the laminate substrate 142 is configured to be dimensioned to enable the pick and place assembly of the molded transformer 140 so that the laminate substrate 142 rests on the supports 134a, 134b. Step 304 comprises the in-process isolated power converter package 100 shown in FIG. 3D after wirebonding to provide wirebonds 171, 172, 173 and 174. Step 305 in FIG. 3E shows the isolated power converter package 100 as a molded package after molding to form the mold compound 191.

Figure 4A:
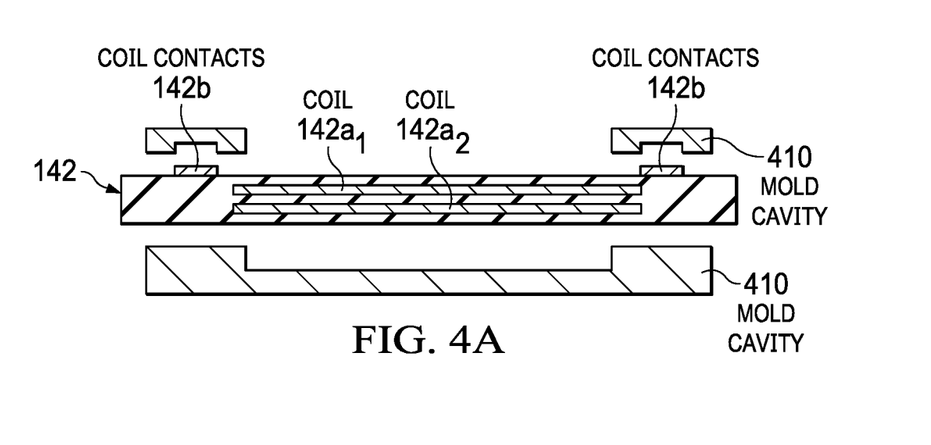
FIG. 4A shows results after loading at least one laminate substrate having coil contacts typically in the form of a laminate substrate board including a plurality of laminate substrates, into a mold cavity of a mold apparatus.
Figure 4B:
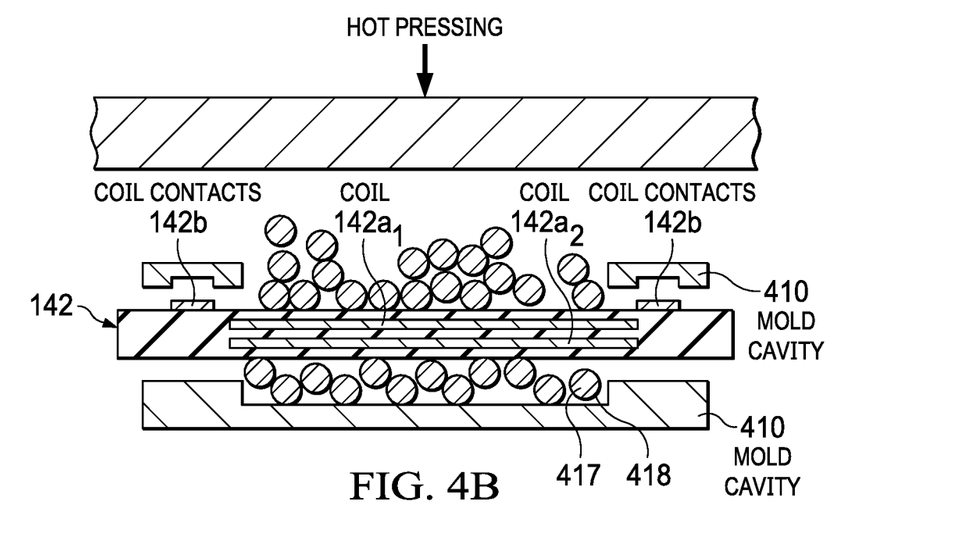
FIG. 4B shows compression molding a magnetic mold compound powder including both magnetic material and a second dielectric material, represented by a plurality of particles located above and below the laminate substrate using hot pressing and heat.
Figure 4C:
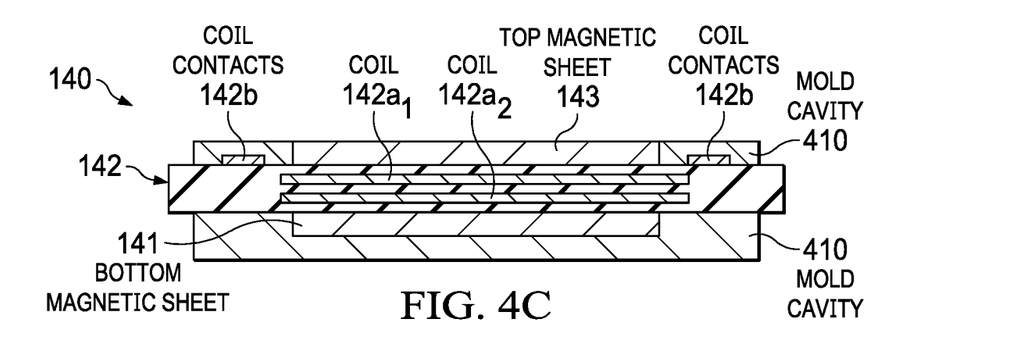
FIG. 4C shows the results following the compression molding step where a top side magnetic sheet and a bottom side magnetic sheet comprising a magnetic mold compound are shown on respective sides of the laminate substrate.

FIGS. 4A-E depict steps and results for an example method for forming a disclosed molded transformer. FIG. 4A shows results after loading at least one laminate substrate 142 having coil contacts 142b typically in the form of a laminate substrate board including a plurality of laminate substrates, into a mold cavity 410 of a molding apparatus. The mold cavity is designed to protect the coil contacts 142b from receiving mold. FIG. 4B shows compression molding a magnetic mold compound powder represented by a plurality of magnetic particles 417 that are encapsulated by a second dielectric material 418 that is located above and below the laminate substrate 142 using hot pressing and heat. The magnetic particles can comprise iron oxide, permalloy or an amorphous alloy. The second dielectric material 418 can provide a coating for the magnetic particles 417. FIG. 4C shows the results following the compression molding step where a top side magnetic sheet 143 and a bottom side magnetic sheet 141 both comprising a disclosed magnetic mold material are shown on respective sides of the laminate substrate 142.

The respective magnetic sheets 143, 141 after molding can be electrically isolated from one another by the dielectric of the laminate substrate 142, or can be electrically connected to be shorted together. In both of these arrangements, the magnetic mold compound generally encloses the laminate substrate 142, except for the coil contacts 142b located on the top side of the laminate substrate 142 for enabling a wirebond connection. For the electrically connected magnetic sheet arrangement, one can drill through-holes through the laminate substrate 142 before the molding.

Figure 4D:
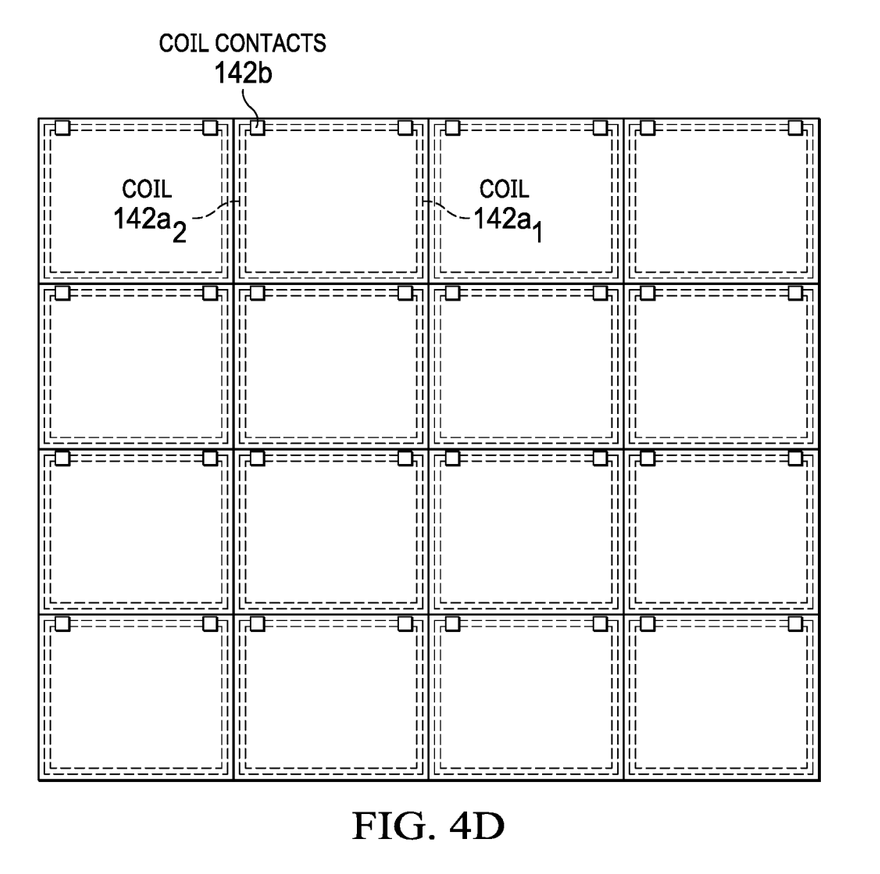
FIG. 4D shows results from a selective mold removing step that can comprise laser peeling to expose the coil contacts, where a portion of a laminate board is shown.
Figure 4E:
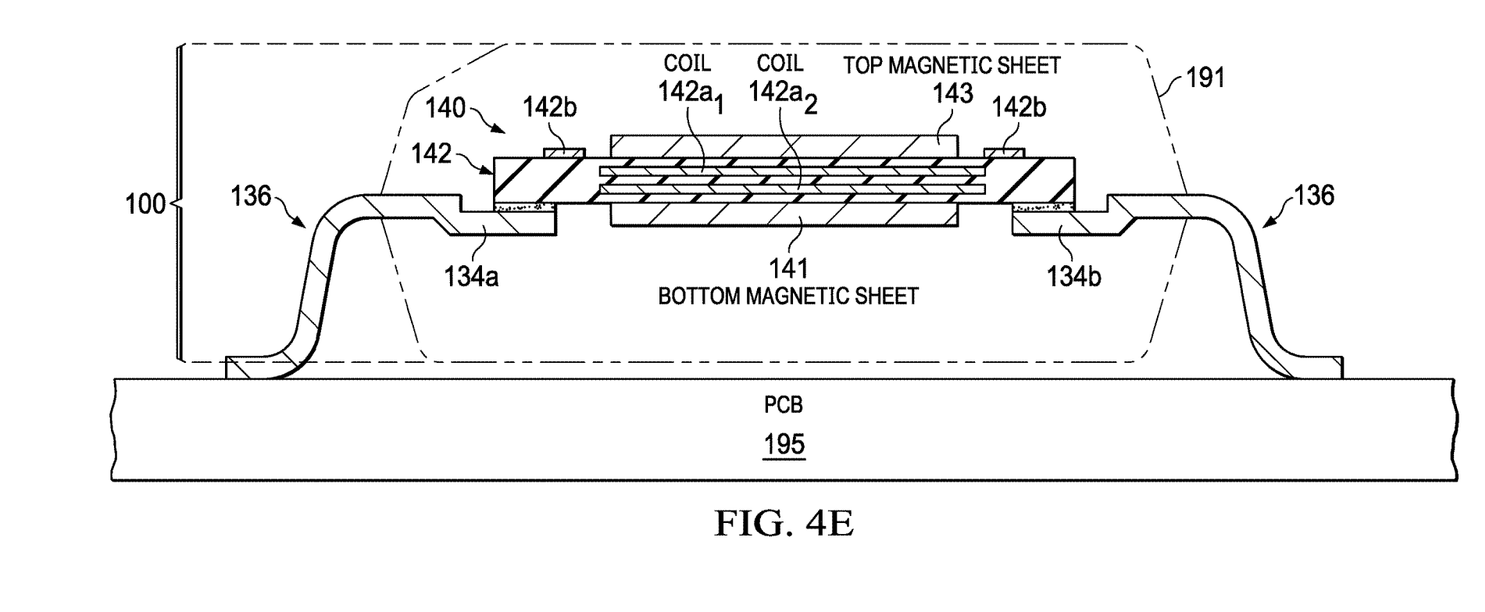
FIG. 4E shows results after dicing the laminate board to form a plurality of molded transformers, with one of the molded transformers shown after picking and placing onto a die attach material that is on supports of a leadframe, followed by curing the die attach material.

FIG. 4D shows results from a selective mold removing step that can comprise laser peeling or a plasma treatment to expose the coil contacts 142b, where a portion of a laminate board is shown. FIG. 4E shows the isolated power converter package 100 on a PCB 195 as results after dicing the laminate board to provide a plurality of molded transformers, with one of the molded transformers 140 shown for the package 100 after picking and placing onto a die attach material that is on supports of a leadframe, followed by curing the die attach material, and then wirebonding.

Figure 4F:
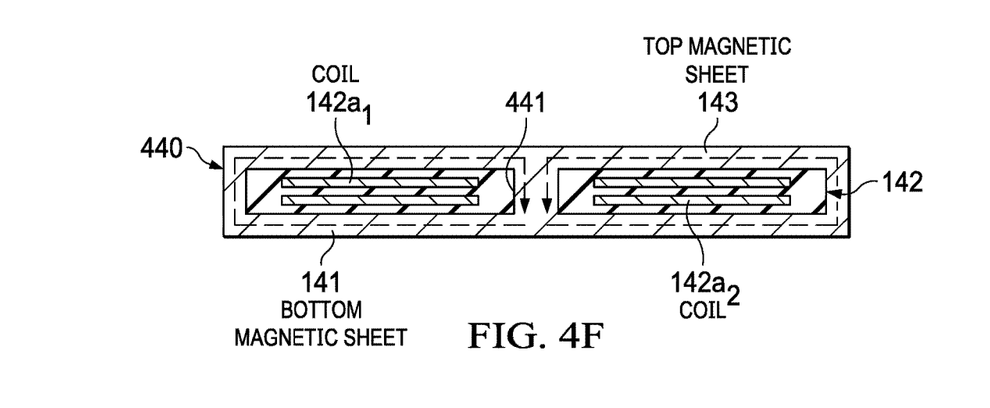
FIG. 4F shows the results following optionally forming through-holes through the laminate substrate before compression molding and after the compression molding step, where the through-holes are positioned for the magnetic mold compound to form after molding a closed-loop around the coils of the cores to provide EI cores besides the top side magnetic sheet and a bottom side magnetic sheet on respective sides of the laminate substrate as shown in FIG. 4C.

FIG. 4F shows a cross-sectional view of the results shown as a molded transformer 440 following optionally forming through-holes through the dielectric of the laminate substrate 142 before compression molding configured so that after the compression molding step the magnetic mold compound includes a connection region 441 that connects together the respective magnetic sheets 143, 141. The connection region 441 completes a closed-loop around the respective coils 142a1, 142a2 to provide EI cores besides the top side magnetic sheet 143 and a bottom side magnetic sheet 141 on respective sides of the laminate substrate 142 as shown in FIG. 4C.

Figure 5:
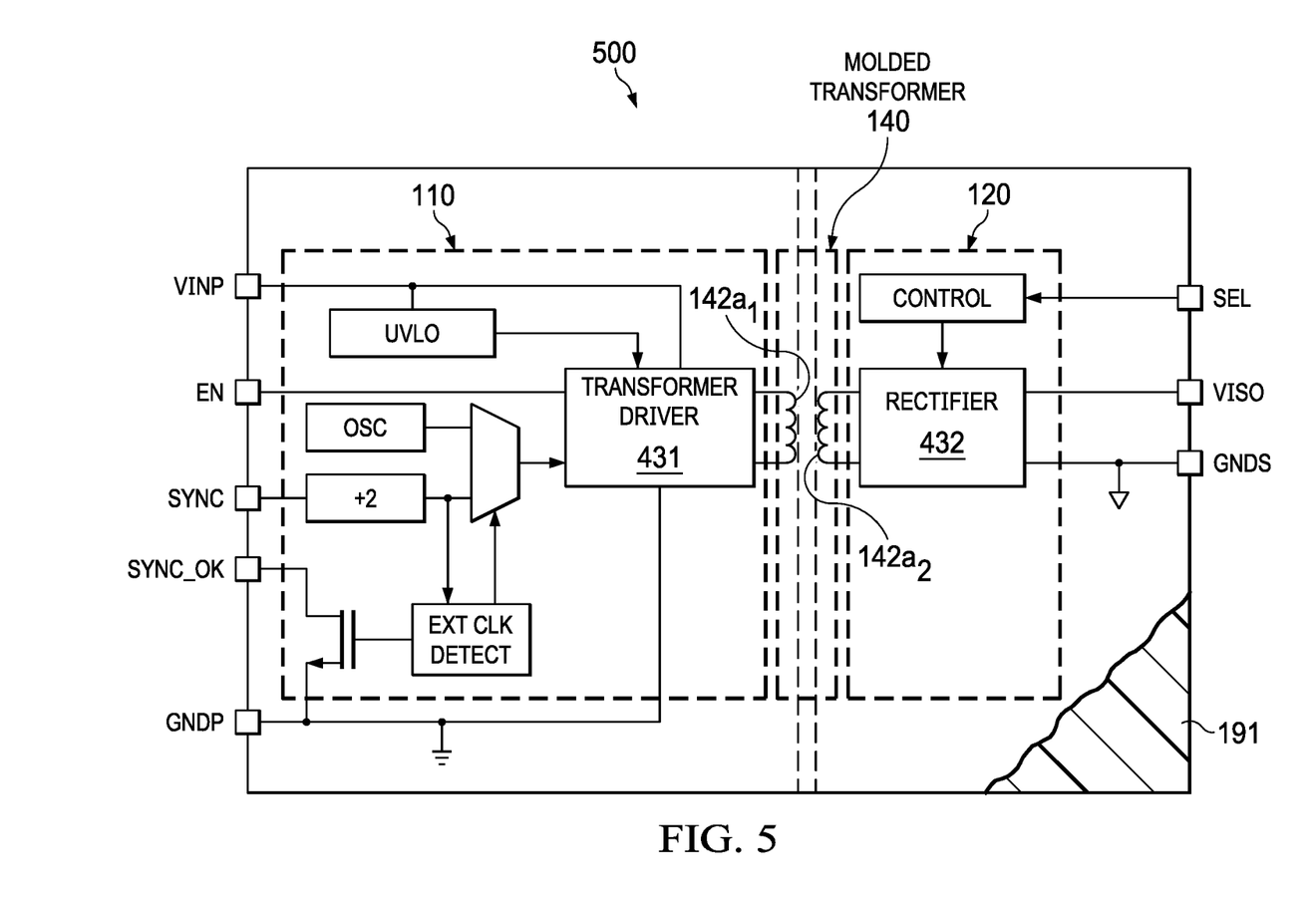
FIG. 5 shows a functional block diagram for an example isolated DC-DC converter package that utilizes a disclosed molded transformer. The isolated DC-DC converter package comprises a leadframe including supports for a molded transformer, and first and second die pads with its respective pins being shown. The isolated DC-DC converter includes first and second semiconductor die mounted on the respective die pads. The molded transformer is on the supports, where the molded transformer is connected between the first and the second semiconductor die to provide isolation.

FIG. 5 shows a functional block diagram for an example isolated DC-DC converter package 500. The isolated DC-DC converter package 500 comprises a leadframe including supports for a molded transformer 140 including at least a first and a second coil 142a1 and 142a2 that is embedded in a laminate substrate shown above as 142, and first and second die pads with its respective pins representing the leadframe being shown.

The isolated DC-DC converter package 500 comprises a primary side including a first semiconductor die 110 (that is on a first die pad 131 shown in FIG. 2) that includes a transformer driver 431 and a secondary side including a second semiconductor die 120 (that is on a second die pad 132 shown in FIG. 2) including a rectifier 432. The molded transformer 140 is positioned in series to provide high-voltage isolation between the first semiconductor die 110 and the second semiconductor die 120.

Disclosed aspects also include a standalone molded transformer, comprising a laminate substrate comprising a first coil and a second coil and a dielectric material. There is a top side magnetic sheet and a bottom side magnetic sheet on respective sides of the laminate substrate. The top side and the bottom side magnetic sheet each comprise magnetic particles embedded within a mold compound that generally comprises an epoxy thereon that more generally can comprise a curable (cross-linkable) polymer. There are coil contacts on a top surface of the laminate substrate beyond an area of the top side magnetic sheet.

The disclosed use of a magnetic mold compound to provide top and bottom magnetic sheets to form a disclosed molded transformer can simplify the integration process of forming the transformer for a high-power isolated power converter and also ensure the isolation performance and reliability of the device. The molded transformer without any significant number of voids and disclosed molding methods can eliminate two of the three above-described conventional transformer mount and cure processes, and can significantly reduce the partial discharge caused yield loss. Partial discharge is an electrical discharge that does not completely bridge the gap between two electrodes. Partial discharge can slowly erode the insulating material until failure. Partial discharge happens in power systems, but usually occurs in components when having voids in the high E-field zoom. The molded transformer also provides a cost reduction because the disclosed assembly method can significantly reduce the number of mount processes and associated material.

Disclosed molded transformers can as described above implement alternative arrangements such as a U-I core, T-I core, or a E-I core which can further increase the power converter's efficiency. A conventional magnetic core is a flat magnetic sheet, one core on the primary side of the transformer, and one core on the secondary side of the transformer. The conventional cores being flat sheets are not closed loop and will thus have magnetic flux leakage. As described above to implement closed-loop cores, one can form through-holes in the laminate substrate, where the molding with magnetic mold compound can form different core structures by adding a connection region between the top and bottom magnetic sheets to provide the closed loop core features.

The magnetic properties of the magnetic mold compound due to the presence of the mold material (which is not magnetic) will generally be somewhat lower as compared to a conventional sintered magnetic sheet which lacks a mold material. For the magnetic mold compound the typical magnetic permeability is 15 to 25, such as around 22. For the conventional magnetic sheet, the typical magnetic permeability is around 80. However, the magnetic mold compound as described above can provide a better integration solution to form a molded transformer by eliminating the need for die attach material conventionally needed to attach the respective magnetic sheets to the laminate substrate, and also facilitating use of closed-loop cores. Therefore, with a disclosed molded transformer design, the molded transformer despite having reduced magnetic properties can still provide a higher power conversion efficiency as compared to a conventional transformer. Typical conventional transformer efficiencies are generally around 75%, with a disclosed molded transformer design including closed-loop cores, the molded transformer can reach a 90% efficiency.

Disclosed aspects can be integrated into a variety of assembly flows to form a variety of different semiconductor packages and related products. The semiconductor package can comprise a single IC die or more typically multiple IC die, such as configurations comprising a plurality of stacked IC die, or laterally positioned IC die. A variety of package substrates may be used. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions, and modifications may be made to the above-described aspects without departing from the scope of this Disclosure.

The invention claimed is:

1. An isolated power converter package, comprising:
a leadframe including a first die pad and a second die pad, first and second supports for supporting a molded transformer connected to a first plurality of leads, a second plurality of leads;
a first semiconductor die including first bond pads on the first die pad and a second semiconductor die including second bond pads on the second die pad;
the molded transformer attached to the first and the second supports by a die attach material, the molded transformer comprising a top side magnetic sheet and a bottom side magnetic sheet on respective sides of a laminate substrate, the laminate substrate comprising at least a first coil and a second coil and a dielectric material, including coil contacts on a top surface of the laminate substrate, wherein the top side and the bottom side magnetic sheet each comprise a magnetic mold material comprising magnetic particles and a second dielectric material;
bond wires between the first bond pads and the second plurality of leads, between the second bond pads and the second plurality of leads, between the first bond pads and the coil contacts, and between the second bond pads and the coil contacts, and
a mold compound providing encapsulation for the first semiconductor die, the second semiconductor die, and the molded transformer.

2. The isolated power converter package of claim 1, wherein the magnetic particles include small particles and large particles that have a size which is at least five times that of the small particles.

3. The isolated power converter package of claim 1, further comprising through-holes in the laminate substrate, wherein the magnetic mold material encloses the first coil and the second coil to provide closed-loop geometries.

4. The isolated power converter package of claim 1, wherein the first semiconductor die comprises a gate driver, and wherein the second semiconductor die comprises a power field effect transistor (FET) module comprising at least one power FET.

5. The isolated power converter package of claim 1, wherein the first semiconductor die and the second semiconductor die are both attached with a thermally conductive die attach material that provides a 25° C. thermal conductivity of at least 1 W/m·K, and wherein the laminate substrate is attached to the first and the second supports with a thermally conductive die attach material that provides a 25° C. thermal conductivity of at least 1 W/m·K.

6. The isolated power converter package of claim 1, wherein the magnetic particles are encapsulated by the second dielectric material.

7. The isolated power converter package of claim 1, wherein the magnetic mold compound has a magnetic permeability from 15 to 25.

8. A method of forming an isolated power converter package, comprising:
providing a molded transformer comprising a laminate substrate comprising a first coil and a second coil and a dielectric material, a top side magnetic sheet and a bottom side magnetic sheet each comprising a magnetic mold material including magnetic particles in a second dielectric material on respective sides of the laminate substrate, including coil contacts on a top surface of the laminate substrate;
dispensing a die attach material onto a first die pad and a second die pad, on first supports and on second supports for supporting the molded transformer of a leadframe, the leadframe including a first plurality of leads connected to the first and the second supports and a second plurality of leads;
positioning a first semiconductor die including first bond pads on the first die pad, a second semiconductor die including second bond pads on the second die pad, and the molded transformer with edges of the laminate substrate on the first and the second supports;
wirebonding between the first bond pads and the second plurality of leads, between the second bond pads and the second plurality of leads, between the first bond pads and contacts on the laminate substrate, and between the second bond pads and contacts on the laminate substrate, and molding to form a mold compound providing encapsulation for the first semiconductor die, the second semiconductor die, and for the molded transformer.

9. The method of claim 8, further comprising forming the molded transformer, comprising:

loading at least one laminate substrate into a mold cavity, where the mold cavity is configured to protect the coil contacts;

filling the mold cavity with the magnetic particles and the second dielectric material;

compression molding to form a top side magnetic sheet and a bottom side magnetic sheet on respective sides of the laminate substrate, the respective magnetic sheets each comprising the magnetic mold material and the second dielectric material, and exposing the coil contacts.

10. The method of claim 8, further comprising picking and placing the molded transformer onto the first and second supports that have a die attach material thereon.

11. The method of claim 8, further comprising before the loading forming through-holes in the laminate substrate so that the magnetic mold material encloses the first coil and the second coil to provide closed-loop geometries.

12. The method of claim 8, wherein the edges of the laminate substrate are attached to the supports by a thermally conductive adhesive material having a 25° C. thermal conductivity of at least 1 W/m·K.

13. The method of claim 8, wherein the first semiconductor die comprises a gate driver, and wherein the second semiconductor die comprises a power field effect transistor (FET) module comprising at least one power FET.

14. The method of claim 8, further comprising forming through-holes through the laminate substrate before the loading, wherein after the compression molding the top side magnetic sheet and the bottom side magnetic sheet are electrically connected together through the laminate substrate.

15. The method of claim 8, wherein the magnetic particles are encapsulated by the second dielectric material.

16. The method of claim 8, wherein the first and the second supports are both attached with a thermally conductive die attach material that provides a 25° C. thermal conductivity of at least 1 W/m·K.

17. An isolated DC-DC converter package, comprising:

a leadframe including a first die pad and a second die pad, first and second supports for supporting a molded transformer connected to a first plurality of leads, a second plurality of leads;

a first semiconductor die comprising a gate driver including first bond pads on the first die pad and a second semiconductor die comprising a power field effect transistor (FET) module comprising at least one power FET including second bond pads on the second die pad;

the molded transformer comprising a top side magnetic sheet and a bottom side magnetic sheet each comprising a magnetic mold material comprising magnetic particles and a second dielectric material encapsulating the magnetic particles on respective sides of a laminate substrate comprising a first coil and a second coil and a dielectric material, including coil contacts on a top surface of the laminate substrate;

wherein edges of the laminate substrate are attached to the supports;

bond wires between the first bond pads and the second plurality of leads, between the second bond pads and the second plurality of leads, between the first bond pads and the coil contacts, and between the second bond pads and the coil contacts, and a mold compound providing encapsulation for the first semiconductor die, for the second semiconductor die, and for the molded transformer.

18. The isolated DC-DC converter package of claim 17, wherein the magnetic particles include small particles and large particles that have a size which is at least five times that of the small particles.

19. The isolated DC-DC converter package of claim 17, further comprising through-holes in the laminate substrate, wherein the magnetic mold material encloses the first coil and the second coil to provide closed-loop geometries.

20. The isolated DC-DC converter package of claim 17, wherein the first and the second supports are both attached with a thermally conductive die attach material that provides a 25° C. thermal conductivity of at least 1 W/m·K.

\* \* \* \* \*